US011799065B2

(12) United States Patent
Yamada et al.

(10) Patent No.: US 11,799,065 B2
(45) Date of Patent: Oct. 24, 2023

(54) METHOD OF PRODUCING HEAT DISSIPATION SUBSTRATE AND METHOD OF PRODUCING COMPOSITE SUBSTRATE

(71) Applicant: NICHIA CORPORATION, Anan (JP)

(72) Inventors: Shoichi Yamada, Anan (JP); Takeshi Kihara, Tokushima (JP); Masatsugu Ichikawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 232 days.

(21) Appl. No.: 17/161,305

(22) Filed: Jan. 28, 2021

(65) Prior Publication Data

US 2021/0242385 A1    Aug. 5, 2021

(30) Foreign Application Priority Data

Jan. 31, 2020  (JP) ................................. 2020-015339
Apr. 10, 2020  (JP) ................................. 2020-071264
Jan. 22, 2021  (JP) ................................. 2021-009002

(51) Int. Cl.
*H01L 33/64*    (2010.01)
*B22F 3/12*    (2006.01)
(Continued)

(52) U.S. Cl.
CPC ............ *H01L 33/641* (2013.01); *B22F 3/105* (2013.01); *B22F 3/12* (2013.01); *B22F 7/06* (2013.01); *H01L 21/4871* (2013.01); *H01L 23/3732* (2013.01); *H01L 23/3736* (2013.01); *B22F 2202/06* (2013.01); *B22F 2301/10* (2013.01);
(Continued)

(58) Field of Classification Search
CPC .............. B22F 3/105; B22F 2003/1051; B22F 2301/10; B22F 2003/247; B22F 2302/406; H01L 23/3732; H01L 33/641
See application file for complete search history.

(56) References Cited

U.S. PATENT DOCUMENTS 6,001,304 A * 12/1999 Yoo ..................... C04B 35/6455
2005/0051891 A1   3/2005 Yoshida et al.
(Continued)

FOREIGN PATENT DOCUMENTS

EP        3 754 038 A1   12/2020
JP        2008-248324 A  10/2008
(Continued)

OTHER PUBLICATIONS

Rosinski, M., et al. "Synthesis and characterization of the diamond/copper composites produced by the pulse plasma sintering (PPS) method." Diamond and related materials 27 (2012): 29-35. (Year: 2012).*

*Primary Examiner* — Sally A Merkling
*Assistant Examiner* — Sean P. O'Keefe
(74) *Attorney, Agent, or Firm* — Foley & Lardner LLP

(57) ABSTRACT

A method of producing a heat dissipation substrate, the method including: providing a composite material containing diamond and a metal; performing a treatment on a surface of the composite material to reduce a thickness of the composite material, the treatment forming a processed surface of the composite material; and subsequently, performing pulsed electric current sintering with a pressure of less than 50 MPa applied to the composite material, to heat the composite material.

19 Claims, 11 Drawing Sheets

(51) Int. Cl.
*H01L 23/373* (2006.01)
*B22F 3/105* (2006.01)
*B22F 7/06* (2006.01)
*H01L 21/48* (2006.01)

(52) U.S. Cl.
CPC ..... *B22F 2302/406* (2013.01); *B22F 2304/10* (2013.01)

(56) References Cited

U.S. PATENT DOCUMENTS

| | | |
|---|---|---|
| 2011/0198771 A1 | 8/2011 | Hirotsuru et al. |
| 2014/0321060 A1* | 10/2014 | Ishii ............... H01L 23/3732 419/11 |
| 2016/0336253 A1 | 11/2016 | Fukui |
| 2018/0328677 A1 | 11/2018 | Kim et al. |

FOREIGN PATENT DOCUMENTS

| | | | |
|---|---|---|---|
| JP | 2019-502251 A | 1/2019 | |
| WO | WO-03/040420 A1 | 5/2003 | |
| WO | WO-2010/007974 A1 | 1/2010 | |
| WO | WO-2011072961 A1 * | 6/2011 | ............. B22F 3/105 |
| WO | WO-2016/056637 A1 | 4/2016 | |
| WO | WO-2019/159694 A1 | 8/2019 | |

* cited by examiner

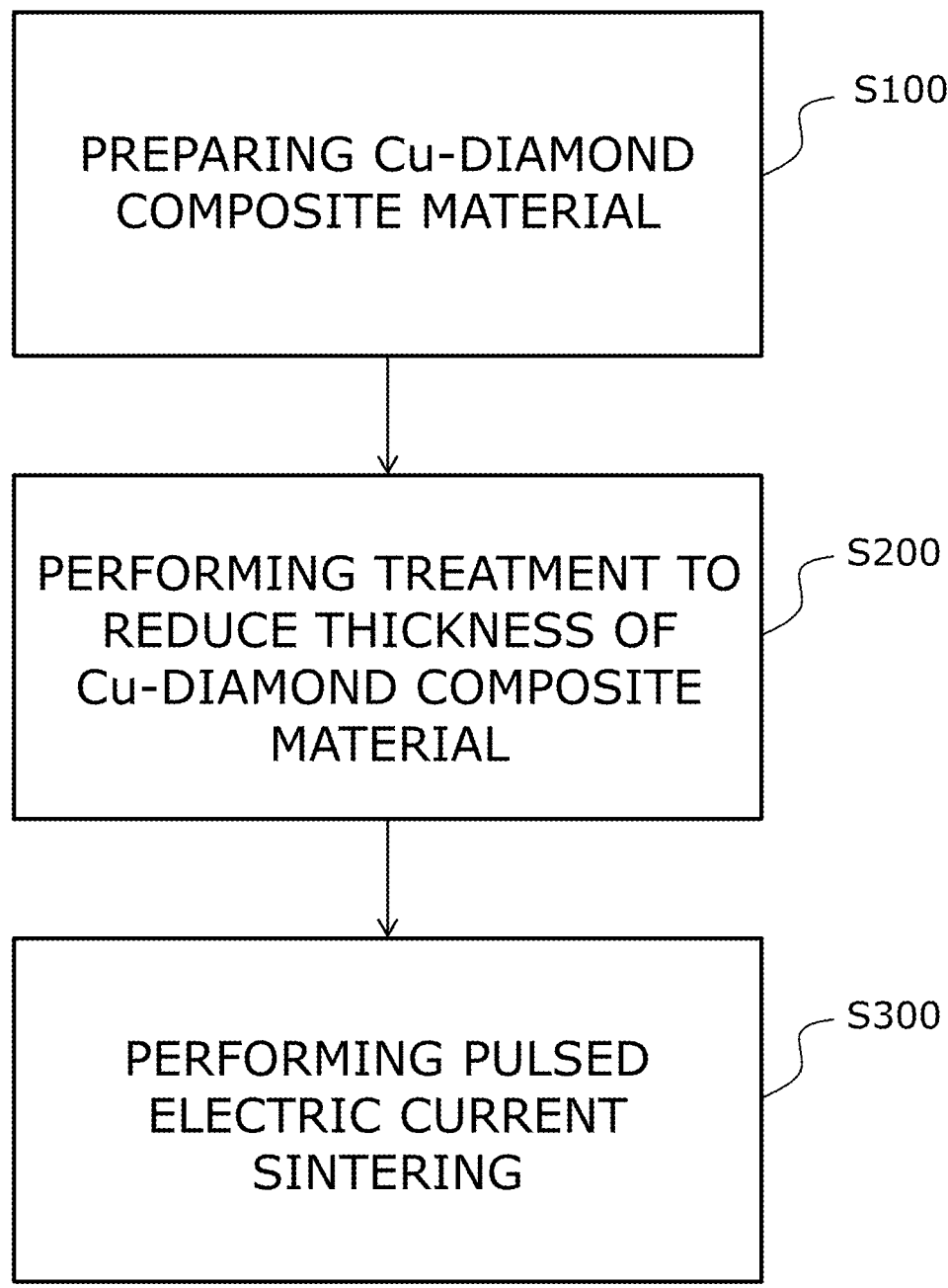

METHOD OF PRODUCING HEAT DISSIPATION SUBSTRATE AND METHOD OF PRODUCING COMPOSITE SUBSTRATE

CROSS-REFERENCE TO RELATED APPLICATIONS

This application claims priority to Japanese Patent Application No. 2020-015339, filed on Jan. 31, 2020, Japanese Patent Application No. 2020-071264, filed on Apr. 10, 2020, and Japanese Patent Application No. 2021-9002, filed on Jan. 22, 2021, the entire contents of which are hereby incorporated by reference.

BACKGROUND

The present disclosure relates to methods of producing a heat dissipation substrate comprising diamond particles and a metal, and methods of producing a composite substrate.

With an increase in the light emission power of semiconductor light emitting devices, significance of heat dissipation from a semiconductor element has been increased. Significance of heat dissipation from a semiconductor element has been increased not only for semiconductor light emitting devices but also for semiconductor integrated circuit devices that execute computational processing at high speed, monolithic microwave integrated circuit devices that perform microwave oscillation, etc.

In order to dissipate heat from such a semiconductor device that generates heat during operation, heat dissipation members such as a heat dissipation substrate that dissipate heat from a semiconductor device have been studied. Heat dissipation members are demanded to have a high thermal conductivity. As a promising material for heat dissipation substrates, a composite material comprising diamond and a metal has been under development. Such a composite material has a structure in which particles of diamond, which has a higher thermal conductivity than those of metals, are dispersed in a metal such as copper (Cu).

Japanese Patent Publication No. 2019-502251 describes an example of such a composite material in which diamond particles are dispersed in Cu. Japanese Patent Publication No. 2008-248324 describes a method of producing a composite material in which diamond particles are covered with a metal layer and then the diamond particles are sintered together with a Cu powder. PCT Publication No. WO 2016/056637 describes a heat dissipation substrate in which a plating metal layer is formed on a composite material in which diamond particles are dispersed in Cu.

SUMMARY

The present disclosure provides a method of producing a heat dissipating substrate and a method of producing a composite substrate that allow for increasing a thermal conductivity that has been lowered due to a treatment to reduce thickness in a production process.

According to one embodiment, a method of producing a heat dissipation substrate includes providing a composite material comprising diamond and a metal, performing a treatment to reduce thickness on a surface of the composite material to form a processed surface of the composite material, and heating the composite material by pulsed electric current sintering with a pressure of less than 50 MPa applied to the composite material.

According to another embodiment, a method of producing a composite substrate includes providing a composite material comprising diamond and a metal, performing a treatment to reduce thickness on a surface of the composite material to form a processed surface of the composite material, and heating the composite material by pulsed electric current sintering with a pressure of less than 50 MPa applied to the composite material.

According to certain embodiments of the present disclosure, the thermal conductivity lowered due to the treatment to reduce thickness in the production process can be improved by performing pulsed electric current sintering.

BRIEF DESCRIPTION OF THE DRAWINGS

FIG. 3A is a flowchart showing main steps in a method of producing a heat dissipation substrate according to an embodiment of the present disclosure.

DETAILED DESCRIPTION

Prior to the description of certain embodiments of the present disclosure, the present inventors' findings and the background thereof will be described.

Figure 1:
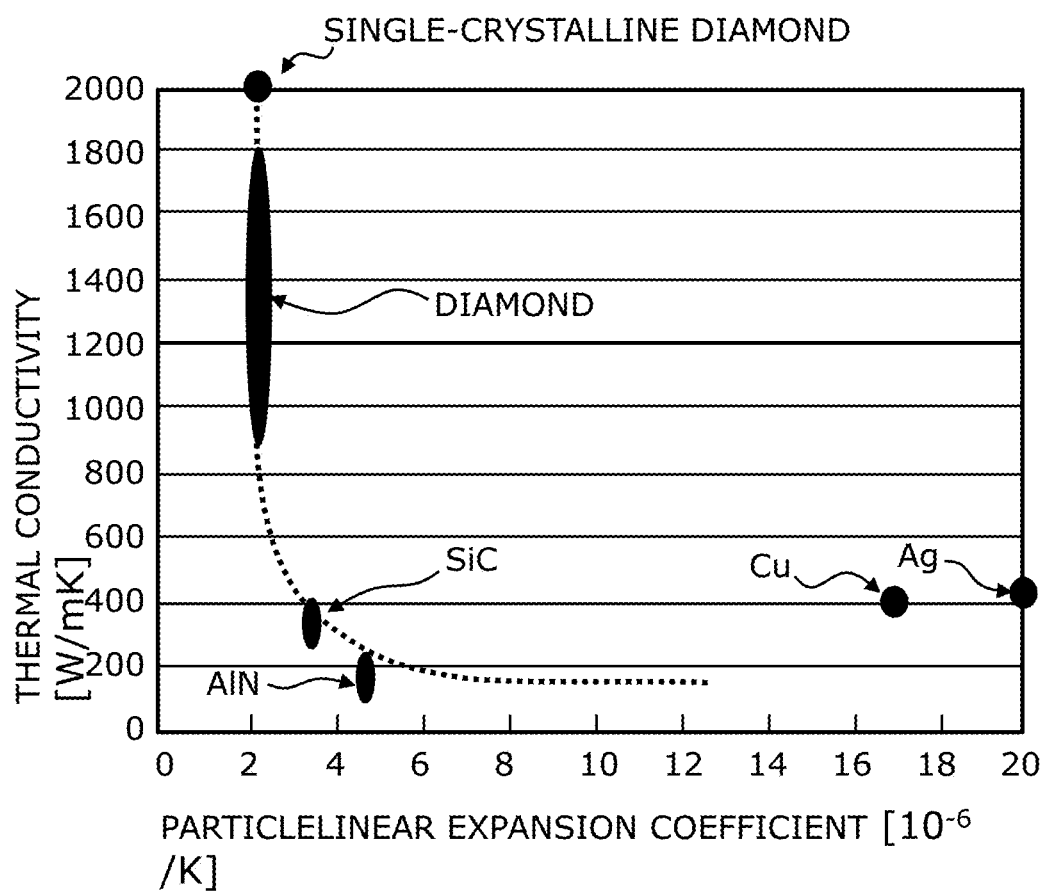
FIG. 1 is a graph in which coefficients of linear expansion and thermal conductivities of materials such as diamond and Cu are plotted.

FIG. 1 is a graph in which coefficients of linear expansion and thermal conductivities of materials such as diamond and Cu are plotted. In the graph, the horizontal axis represents coefficients of linear expansion, and the vertical axis represents thermal conductivities. The coefficient of linear expansion, which is a linear expansion rate per unit length, is expressed in units of [10-6/K]. The thermal conductivity is expressed in units of [W/mK] (watt per meter per kelvin).

Single-crystalline diamond has a highest level of thermal conductivity among substances, which ideally exceeds 2000 [W/mK], which is very high. Poly-crystalline diamond particles have a thermal conductivity of, for example, in a range of about 900 to 1800 [W/mK]. Diamond particles produced using CVD have a thermal conductivity of, for example, in a range of about 900 to 1800 [W/mK].

Figure 2:
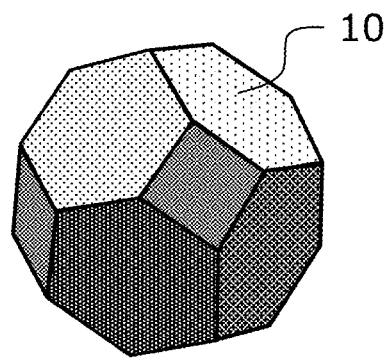
FIG. 2 is a perspective view schematically showing an example of a diamond particle 10.

FIG. 2 is a perspective view schematically showing an example diamond particle 10. The diamond particle 10 as shown in FIG. 2 is in the shape of, for example, a polyhedron having hexagonal and quadrangular faces (facets) at the surface thereof. Actual diamond particles may have more complicated and various shapes, e.g., additionally having other polygonal faces at the surface or being partially chipped. The thermal conductivities of individual diamond particles may have different values, depending on the presence of crystal defects, impurities, or the like at the surface or inside of the particle.

Cu and Ag, which are metals, have a thermal conductivity of about 400 [W/mK] and about 420 [W/mK], respectively. Therefore, the thermal conductivity of a composite material in which diamond particles are dispersed in a metal such as Cu has an intermediate value between the thermal conductivities of the metal and the diamond particle. The greater the volume fraction of the diamond particles contained in the composite material, the greater the theoretical value of the thermal conductivity of the composite material. However, the actual thermal conductivity of the composite material is not determined only by the volume fraction of diamond, and is thought to be affected by the state of the interface between Cu and the diamond particle. The interface between Cu and diamond may be varied, depending on defects and damage or the like to diamond particles that may occur during a production process.

When a semiconductor device is used with a heat dissipation substrate joined thereto, then if there is a large difference in coefficient of linear expansion between the heat dissipation substrate and a member of the semiconductor device in contact with the heat dissipation substrate, e.g., detachment of the semiconductor device from the substrate may occur. Therefore, it is desirable that the coefficient of linear expansion of a composite material used in a heat dissipation substrate be similar to the coefficient of linear expansion of a member to be joined to the heat dissipation substrate.

The composite material comprising diamond particles and Cu has good characteristics, i.e., a thermal conductivity higher than that of Cu, and a coefficient of linear expansion similar to that of semiconductors. A composite material containing a metal as a matrix may be called a metal matrix composite (may be referred to as MMC). Therefore, the composite material in which diamond particles are dispersed in Cu will be also herein referred to as a "Cu-diamond MMC." Alternatively, such a composite material will be also herein simply referred to as a "Cu diamond composite material" or "composite material." Examples of a metal to be used as a matrix of an MMC include Ag, Al, etc., as well as Cu.

It is preferable that, in the case in which a heat dissipation substrate is joined to a semiconductor device, the thickness of the heat dissipation substrate can be adjusted if necessary. However, the present inventors have found that, when a Cu-diamond MMC is polished, the thermal conductivity of the polished Cu-diamond MMC is lower than that before polishing. It is considered that polishing causes decrease in adhesion between diamond and Cu in the Cu-diamond MMC, resulting in a reduction in thermal conductivity.

The present inventors have also found that, after a Cu-diamond composite material prepared as described above is damaged by polishing, the thermal conductivity of the Cu-diamond composite material lowered due to polishing can be increased by performing pulsed electric current sintering at low-temperature and low-pressure. In the polishing, the surface of the Cu-diamond composite material is scraped. This causes all or some of diamond particles located at and near the surface of the composite material to be scraped or come off, together with Cu located near the diamond particles, from the composite material. Such a detachment of diamond particles from the Cu-diamond composite material due to polishing is referred to as "loss of particles." The loss of particles may result in reduction in the smoothness of the surface of the Cu-diamond composite material. Thus, a processed surface resulting from polishing the surface of the composite material, i.e., a polished surface, may not be smooth, and may have recesses and protrusions of sizes similar to the size of the diamond particle. In addition, in such a polishing step, a gap may be formed at the interface between Cu and the diamond particle due to stress applied during polishing to diamond particles remaining in the composite material. With such a gap, the thermal conductivity of the composite material after the polishing step is lower than the thermal conductivity of the composite material before the polishing step. However, it has been found that performing pulsed electric current sintering described below with respect to the polished composite material causes an increase in the thermal conductivity of the composite material. This is thought to be attributed to a reduction of the gap between the diamond particle and Cu, for example. In the description below, such pulsed electric current sintering performed after the polishing step may also be referred to as "second pulsed electric current sintering," distinguishing it from pulsed electric current sintering which is an example of a technique used for producing the composite material.

A method of producing a heat dissipation substrate according to the present disclosure has been made based on the novel findings described above. Certain embodiments of the method of producing a heat dissipation substrate according to the present disclosure will be described below. The heat dissipation substrate is an example of a composite substrate according to the present disclosure.

EMBODIMENTS

FIG. 3A is a flowchart showing main steps in a method of producing a heat dissipation substrate according to an embodiment of the present disclosure. As shown in FIG. 3A, the method of producing a heat dissipating substrate according to the present embodiment includes a step S100 of providing a composite material containing diamond and copper, a step S200 of performing a treatment on a surface of the composite material to reduce a thickness the composite material, the treatment forming a processed surface of the composite material, and a step S300 of performing pulsed electric current sintering with a pressure of less than 50 MPa applied to the composite material to heat the composite material.

In the description below, a case in which Cu is employed as a metal used for the composite material will be described. Examples of such a metal other than Cu include Al and silver (Ag). The metal preferably has a thermal conductivity of 200 [W/mK] or more. The thermal conductivity of Al is about 240 [W/mK], and the thermal conductivity of Ag is about 420 [W/mK]. Therefore, composite materials comprising diamond and these metals can have a high thermal conductivity.

Figure 3B:
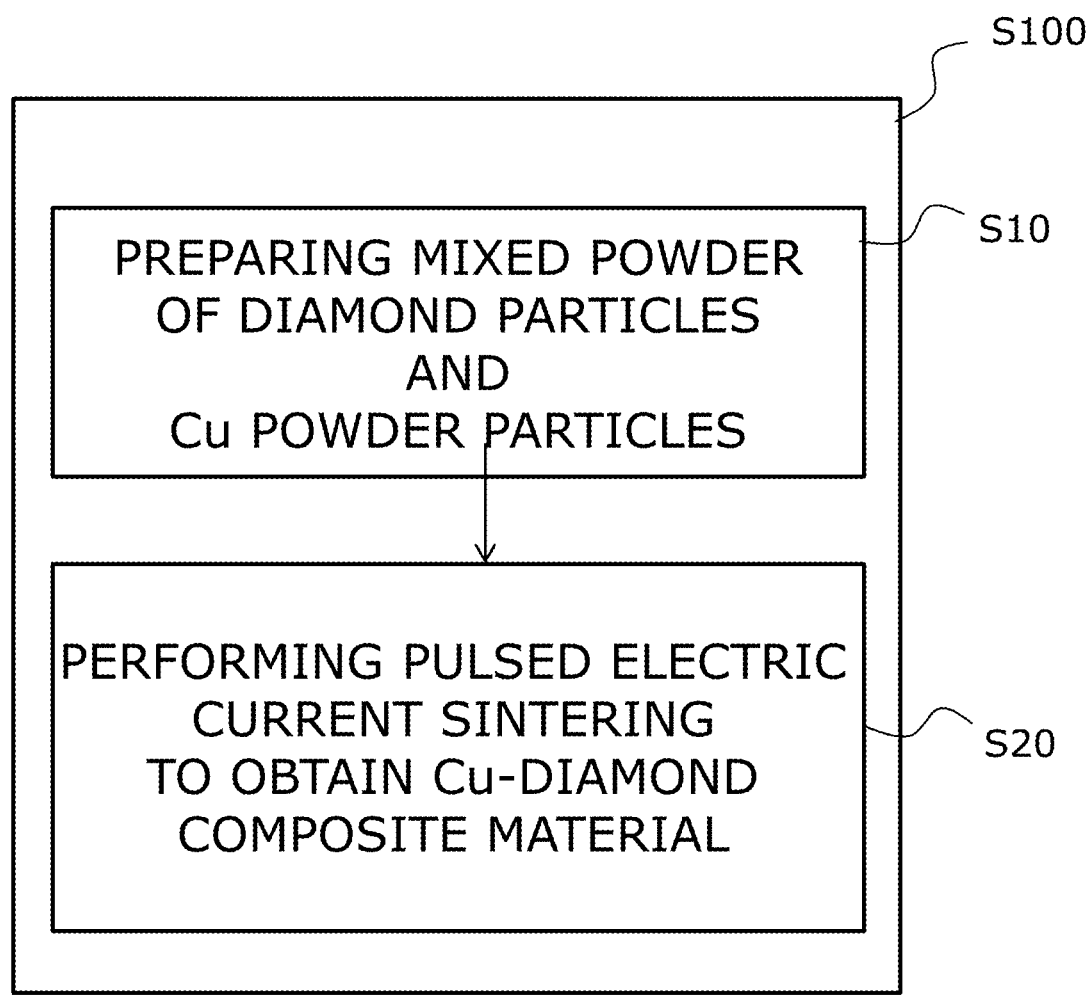
FIG. 3B is a flowchart showing main steps in a method of producing a Cu-diamond composite material in an embodiment of the present disclosure.

The step S100 of providing the composite material of the present embodiment will be described below. FIG. 3B is a flowchart showing a specific example of the step S100 of providing the composite material according to this embodiment. As described above, it is thought that reduction in the thermal conductivity of the composite material is attributed to polishing. Therefore, the effect of the embodiment of the present disclosure does not depend on a technique used for producing the composite material to be provided. In other words, in this embodiment, various composite materials produced by known techniques can be used, e.g., commercially available composite materials may be used. Examples of the technique of producing the composite material include a sintering technique and a melting technique. Techniques preferable for producing the composite material include pulsed electric current sintering. Using this technique allows for obtaining the composite material under relatively low-temperature conditions compared to conventional techniques, as described below.

A method of producing the composite material by pulsed electric current sintering will now be described with reference to FIG. 3B. As shown in FIG. 3B, the step S100 includes a step S10 of providing a mixed powder of diamond particles and Cu powder particles, and a step S20 of performing pulsed electric current sintering with a pressure applied to the mixed powder and the temperature of the mixed powder maintained higher than or equal to 500° C. and lower than 800° C. to obtain a composite material comprising diamond and Cu from the mixed powder. The "temperature" as used herein refers to a temperature as measured directly or indirectly by, for example, a temperature measurement device, such as a radiation thermometer or thermocouple. in the present disclosure, the "temperature" refers to the value of a temperature as measured at a die 30 of a sintering device shown in FIG. 5 described below. A "sintering peak temperature Ts" in the description below refers to a temperature that is maintained at a predetermined pressure for a total of 1 minute or more, of the temperatures of the die 30 as measured by a radiation thermometer or thermocouple. For example, in the case of FIG. 6, the highest temperature that is maintained or holding in the sintering is referred to as a sintering peak temperature Ts, so to be distinguished from transient temperatures during a temperature rise period and a temperature fall period.

Figure 4:
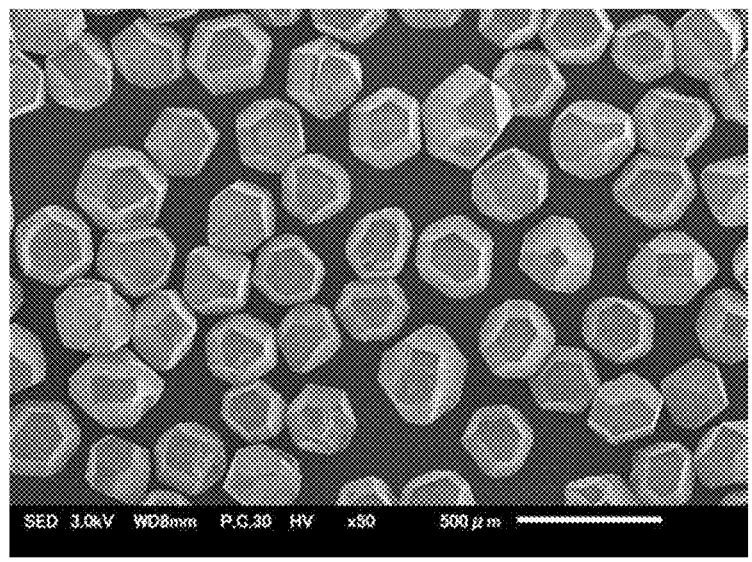
FIG. 4 is a photograph showing an example diamond particle contained in a mixed powder in an example of the present disclosure.

FIG. 4 is a photograph showing an example of the diamond particles contained in the mixed powder in step S10. In one embodiment, the diamond particles have an average particle size of 40 μm or greater and 500 μm or less. The particle size distribution of the diamond particles does not need to be a single-peak distribution having a single peak, and may have multiple peaks. With the average particle size of the diamond particles of 40 μm or more, the Cu-diamond MMC can be produced at low cost, and the thermal conductivity thereof can be increased. With the average particle size of the diamond particles of 500 μm or less, the manufacturing cost of the diamond particles can be reduced. The particle size distribution of the diamond particles is preferably 200 μm or greater and 400 μm or less. Within this range, the thermal conductivity can be further improved. In one embodiment, the diamond particles in the mixed powder may include particles having an average particle size of 200 μm or greater and 400 μm or less, and particles having an average particle size of 40 μm or greater and 80 μm or less. In the present specification, particles having an average particle size of 200 μm or greater and 400 μm or less will be referred to as "large particles," and particles having an average particle size of 40 μm or greater and 80 μm or less will be referred to as "small particles." Particles having a relatively small average particle size can be dispersed to fill gaps between particles having a relatively large average particle size. Therefore, the contained amount of diamond, which has a higher thermal conductivity than that of Cu, can be increased. This allows for further improving the thermal conductivity of the Cu-diamond MMC. In the present specification, such a mixed powder having bimodality in a particle size distribution will be referred to as a "bimodal mixed powder." In a bimodal mixed powder, the proportion (mass fraction) of particles having an average particle size of 200 μm or greater and 400 μm or less to all of the diamond particles is preferably 50% or more. This is because the greater the proportion of particles having a larger average particle size, the smaller the total surface area of the diamond particles, and therefore, the smaller the contribution of thermal resistance at the interface between the diamond particle and Cu.

The average particle size of the Cu powder particles is, for example, 3 μm or greater and 10 μm or less. The Cu powder may contain a Cu fine powder having a particle size of 1 μm or less, which may be generated due to pulverization or the like. The Cu powder particle may contain incidental impurities. Note that impurities such as oxygen and nitrogen are desirably removed as much as possible, because such impurities lead to a reduction in thermal conductivity. The amount of impurities contained in the Cu powder particle is preferably 2 mass % or less. Cu powder particles produced using a known method or that are commercially available may be used for such Cu powder particles.

The "average particle size" as used in the present disclosure refers to a "median diameter" in a particle size distribution as measured by a laser diffraction particle size distribution measurement device.

In embodiments of the present disclosure, a metal other than the Cu powder particle is intentionally not added in order to enhance wettability. Because Cu and diamond have poor wettability, it has been thought that the wettability needs to be improved by an additional metal. On the other hand, in embodiments of the present disclosure, such an additional metal is not required. By intentionally avoiding adding a metal other than the Cu powder particles, the inhibition of sintering can be reduced. In one embodiment, an amount of a metal or metals other than Cu in the mixed powder is 1% or less in mass fraction.

In order to, for example, improve the degree of adhesion between the diamond particle and the Cu powder particle, the individual diamond particles may be covered with a metal layer of copper or the like as described above. However, in embodiments of the present disclosure, the diamond particle is not covered with a metal layer. When the diamond particle is not covered with a metal layer of Cu or the like, the sintering enhancement of the diamond particle can be increased compared to the case in which the diamond particle is covered with a metal layer of Cu or the like. If the diamond particle is covered with a metal layer of Cu or the like, the sintering activity of the diamond particle decreases, and firing needs to be conducted at a high temperature like the case in which a metal is added.

In this embodiment, a mass fraction of the Cu powder particles in the mixed powder is preferably, for example, 60% or greater and 85% or less, and a mass fraction of the diamond particles in the mixed powder is preferably, for example, 15% or greater and 40% or less. In other words, the mass ratio of the Cu powder particles and the diamond particles is selected within the range of 60:40 to 85:15, and is, for example, 80:20. The greater the mass fraction of the diamond particles, the greater the thermal conductivity of the composite material. With the mass fraction of the Cu powder particles of 60% or greater and 85% or less, a sufficient amount of copper is dispersed around diamond, and therefore, spaces or gaps that impede heat conduction are less likely to generated in the Cu-diamond MMC. In other words, if the mass fraction of the Cu powder particles is within the range described above, Cu can have a volume that allows a sufficient amount of Cu to be dispersed around diamond, which can facilitate effectively filling a space between diamond particles with Cu. If the amount of Cu is excessively large, the thermal conductivity of Cu is lower than the thermal conductivity of diamond, which may result in decrease in the thermal conductivity of the Cu-diamond MMC. However, with the mass fraction of the Cu powder particles within the range described above, the Cu-diamond MMC can have a high thermal conductivity. In addition, as will be described below, experiments conducted by the present inventors demonstrated that even if the mass fraction of the diamond particles is the same, a higher thermal conductivity is likely to be obtained using a bimodal mixed powder.

Figure 5:
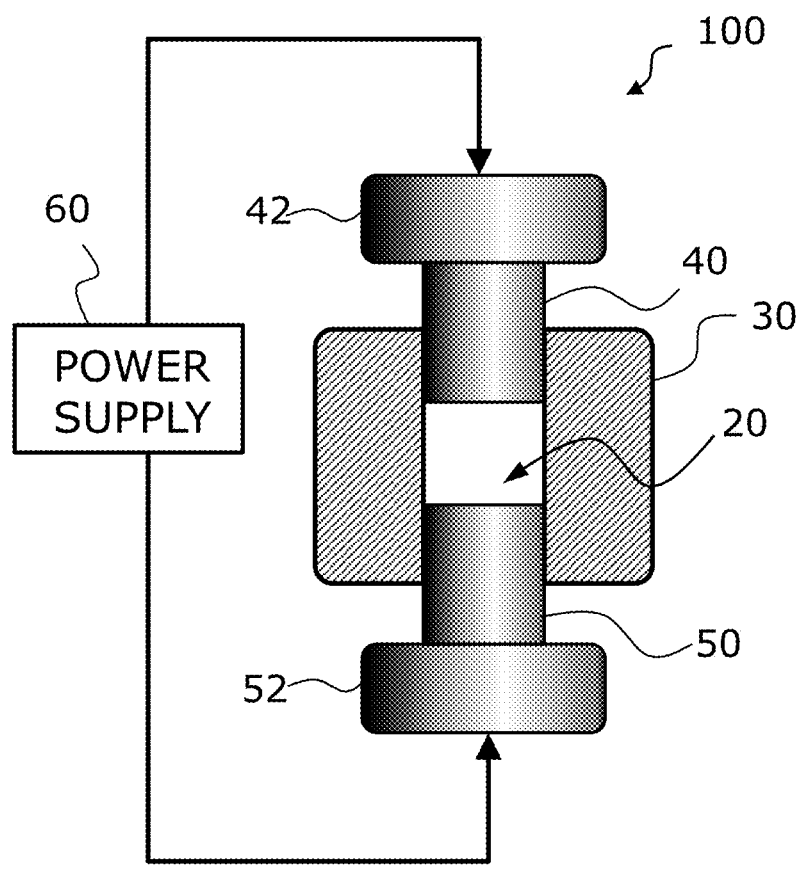
FIG. 5 is a schematic diagram showing an example configuration of a sintering device for use in pulsed electric current sintering in an embodiment of the present disclosure.

In the step S20, pulsed electric current sintering may be performed using, for example, a sintering device 100 shown in FIG. 5. Pulsed electric current sintering is also called spark plasma sintering (SPS). Therefore, the sintering device 100 of FIG. 5 will also be referred to as an "SPS device." The sintering device 100 in FIG. 5 is provided with a die 30 that defines a through hole forming a cavity 20, and an upper punch 40 and a lower punch 50 configured to be moved relatively upward and downward along the through hole of the die 30. The sintering device 100 in this example can perform sintering by utilizing self-heating under vertical uniaxial pressure. The upper punch 40 is electrically connected to a first electrode 51, and the lower punch 50 is electrically connected to a second electrode 52. The first electrode 51 and the second electrode 52 are electrically connected to a power supply unit 60.

The die 30 may be formed of a material having good heat resistance, such as graphite. The upper punch 40 and the lower punch 50 may be formed of a material having electrical conductivity and heat resistance, such as graphite. In measurement of thermal conductivity, the flatter the specimen, the higher the reliability of measurement of thermal diffusivity. Therefore, in the case in which it is difficult to ensure the flatness of a produced sintered body, a hard material is preferably inserted between the upper punch 40 and the specimen and between the lower punch 50 and the specimen so as to allow the sintered body to have flat surfaces. The hard material is preferably a cemented carbide, such as tungsten carbide (WC) or titanium carbide (TiC). The material for the upper punch 40 and the lower punch 50 may be changed to the hard material. The cavity 20 is a space defined by an inner wall surface defining the through hole of the die 30, a lower end surface of the upper punch 40, and an upper end surface of the lower punch 50. The above mixed powder is placed in the inside of the cavity 20. At least one of the upper punch 40 and the lower punch 50 is moved vertically so that the interval between the upper punch 40 and the lower punch 50 is reduced, and a pressure is thereby applied to the mixed powder in the cavity 20. The upper punch 40 and the lower punch 50 are driven by, for example, a hydraulic device (not shown). The pressure applied to the mixed powder in the cavity 20 may be adjusted to an appropriate value within the range of, for example, 5 MPa or greater and 100 MPa or less.

In pulsed electric current sintering, a pulsed electric current is passed between the upper punch 40 and the lower punch 50 by the sintering device 100 with a pressure applied to the mixed powder. The passage of a pulsed electric current is performed by repeatedly applying a pulsed DC electronic current from the power supply unit 60 between the first electrode 51 and the second electrode 52. In the mixed powder pressurized by the upper punch 40 and the lower punch 50, Cu powder particles are in contact with each other, and therefore, a large number of local current paths are formed in the mixed powder, which allows the passage of an electric current. Such passage of a pulsed electric current generates Joule heat, which causes the temperature of the mixed powder to increase to a predetermined sintering temperature.

Figure 6:
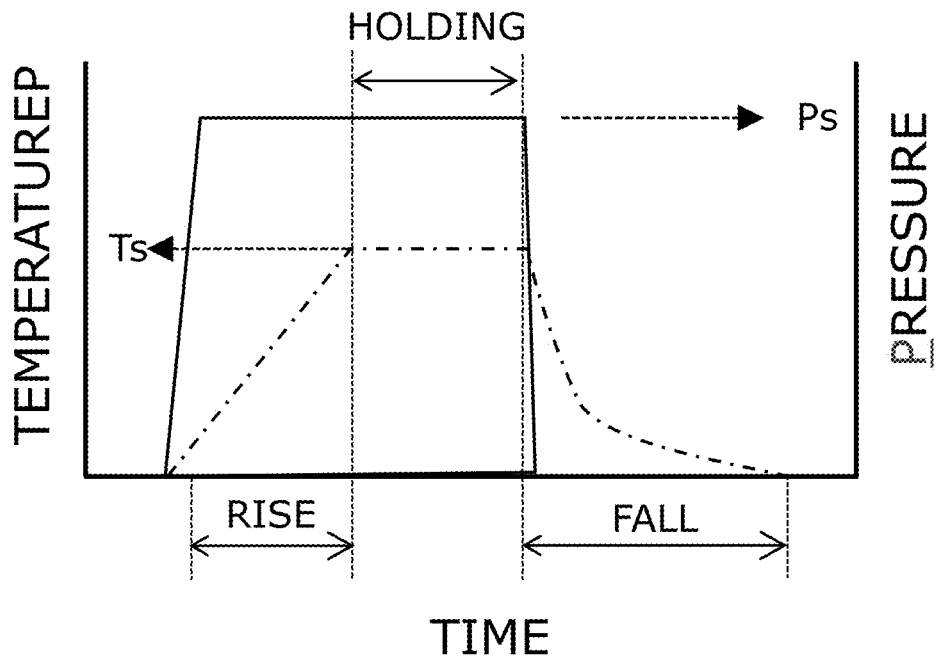
FIG. 6 is a diagram schematically showing an example relationship between a temperature and pressure of a mixed powder, and an elapsed time during a period of time from the start to end of a pulsed electric current sintering step.

FIG. 6 is a diagram schematically showing an example of how the temperature and pressure of the mixed powder change with time during a period of time from the start to end of the pulsed electric current sintering step. The temperature is indicated by a dash-dot line, and the pressure is indicated by a solid line. The horizontal axis represents time, the left vertical axis represents temperature, and the right vertical axis represents pressure. With the movement of the upper punch 40 and/or the lower punch 50, the pressure reaches a sintering pressure Ps in, for example, several seconds, and the sintering pressure Ps is maintained for, for example, 60 to 1800 seconds. After the start of passage of a pulsed electric current, the temperature of the mixed powder increases at a rate of, for example, 10 to 150 [° C./min] or more. After the temperature has reached a predetermined sintering peak temperature Ts, the voltage application conditions for the passage of a pulsed electric current are adjusted so as to maintain the sintering peak temperature Ts within the range of ±5° C. from a target temperature. The control of the sintering temperature can be performed through measurement feedback from a temperature measurement device attached to the die 30 of FIG. 5.

After a predetermined sintering time has passed, so that a composite material has been produced from the mixed powder, the passage of a pulsed electric current is stopped, so that the temperature starts decreasing. In addition, the upper punch 40 and/or the lower punch 50 are moved to stop the application of a pressure to the composite material. After the temperature of the composite material has been sufficiently cooled to, for example, equal to or lower than 50° C., the composite material is removed from the die 30.

FIG. 6 shows that the temperature and pressure increase and plateau linearly with time, for the sake of simplicity. The transition in the actual temperature and pressure may include slight overshoots, curved changes, small fluctuations, and the like.

In this embodiment, in order to maintain the sintering temperature, the voltage is adjusted within the range of 1.0 V or greater and 3.0 V or less, and the pulsed electric current is adjusted within the range of 400 A or greater and 800 A or less. The pulsed electric current has a duty ratio of, for example, 10 to 80%, and a pulse width of, for example, 1 to 500 milliseconds. After the predetermined sintering peak temperature Ts has been maintained for a predetermined period of time, the passage of the pulsed electric current is stopped. These values are varied depending on various conditions such as the weight of the mixed powder, the sintering temperature, the material for the punches, etc., and therefore, are not limited to the ranges described above and can be changed if necessary.

In the case in which the sintering temperature is set to, for example, 600° C., the time it takes to reach from room temperature to the sintering temperature is, for example, several minutes to about 20 minutes. The cavity 20 is located in a reduced-pressure chamber (not shown). The ambient pressure in the reduced-pressure chamber is, for example, 100 Pa or less. Thus, the powder particles can be substantially prevented from being oxidized or nitrized during the sintering step performed by the passage of a pulsed electric current.

The sintering peak temperature Ts in an embodiment of the present disclosure is higher than or equal to 500 and lower than 800° C. as described above. Within this range, a Cu-diamond MMC having good thermal conductivity can be produced. The sintering peak temperature Ts is preferably 500° C. or greater and 750° C. or less, more preferably 550° C. or greater and 700° C. or less, and particularly preferably 600° C. or greater and 700° C. or less. Within these ranges, a Cu-diamond MMC having better thermal conductivity can be obtained. The sintering time, which also depends on the sintering peak temperature Ts, is, for example, 1 minute or more and 30 minutes or less. In the case in which the sintering peak temperature Ts is, for example, 550° C. or greater and 650° C. or less, the sintering time may be 5 minutes or more and 20 minutes or less, e.g., about 10 minutes.

The pressure applied to the mixed powder at the sintering peak temperature Ts is 5 MPa or more and 100 MPa or less, provided that the pressure is maintained constant. With the applied pressure of 5 MPa or more and 100 MPa or less, a Cu-diamond MMC having good thermal conductivity can be produced. The pressure range is preferably 10 MPa or greater and 90 MPa or less, more preferably 20 MPa or greater and 90 MPa or less, even more preferably 25 MPa or greater and 75 MPa or less, and particularly preferably 25 MPa or greater and 50 MPa or less. Within these pressure ranges, a Cu-diamond MMC having good thermal conductivity can be produced. Applying a constant pressure at the sintering peak temperature Ts as described above is herein referred to as "continuous pressurization."

Although an example in which continuous pressurization is used has been described above, the pressure does not need to be constant. The applied pressure may be increased or decreased in a stepwise or continuous manner, depending on how much sintering has proceeded. A first pressure and a second pressure higher than the first pressure may be repeatedly applied to the mixed powder while the passage of a pulsed electric current is performed. Such a pressurization mode will be referred to as "cyclic pressurization." By the cyclic pressurization, in which a first pressure and a second pressure higher than the first pressure are repeatedly applied, a Cu-diamond MMC having a high thermal conductivity can be produced. This is thought to be attributed to, for example, a mechanism described as follows.

There is a difference in absolute value between the first pressure and the second pressure. In repetitive application of the first and second pressures, the first pressure is applied after the second pressure is applied. At this time, the relatively high pressure and then the relatively low pressure are applied, and therefore, the degree of freedom of the diamond particles in the die is higher when the first pressure is applied than when the second pressure is applied. This is thought to allow the arrangement of the diamond particles or the state of the interface between Cu and the diamond particles to be more advantageous in terms of heat conduction. It is also likely that oxygen which is present in the surface of Cu and impedes heat conduction is removed. This is thought to result in improvement in the thermal diffusivity of a Cu-diamond MMC produced by cyclic pressurization is compared to the case in which only the first pressure is applied, which increase thermal conductivity.

The pressures applied to the mixture of the diamond particles and the Cu powder particles, i.e., the first and second pressures, can be set within the range of 5 MPa or greater and 100 MPa or less, such that the second pressure is greater than the first pressure. The first pressure may be 5 MPa or greater and 60 MPa or less, and the second pressure may be 20 MPa or greater and 100 MPa or less. Preferably, the first pressure may be more than or equal to 5 MPa and less than 20 MPa, and the second pressure may be more than or equal to 20 and less than or equal to 40 MPa. If the first and second pressures are within the above respective ranges, the thermal conductivity can be further improved.

Figure 7A:
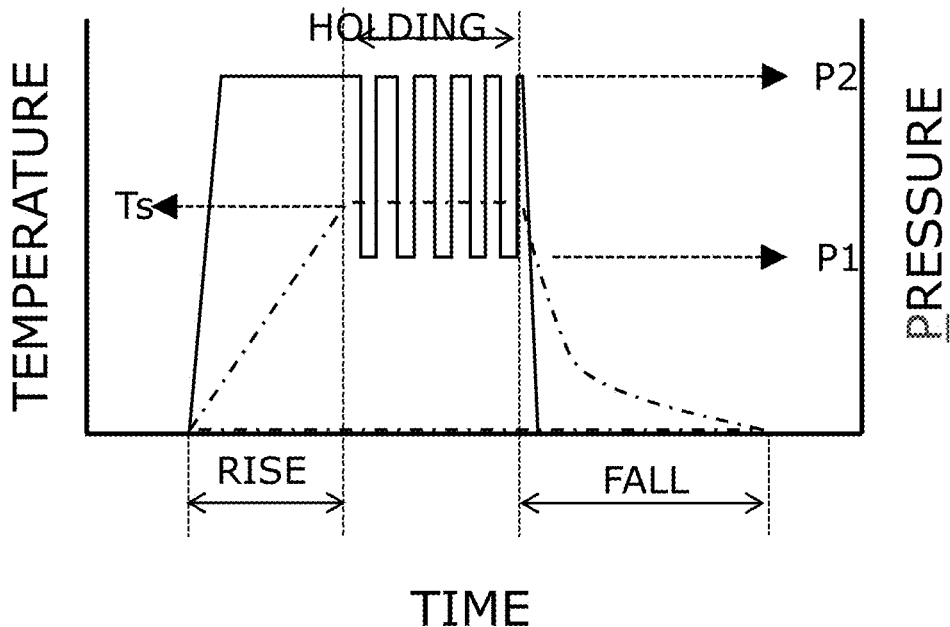
FIG. 7A is a diagram schematically showing another example of the relationship between a temperature and pressure of a mixed powder, and an elapsed time during a period of time from the start to end of a pulsed electric current sintering step.
Figure 7B:
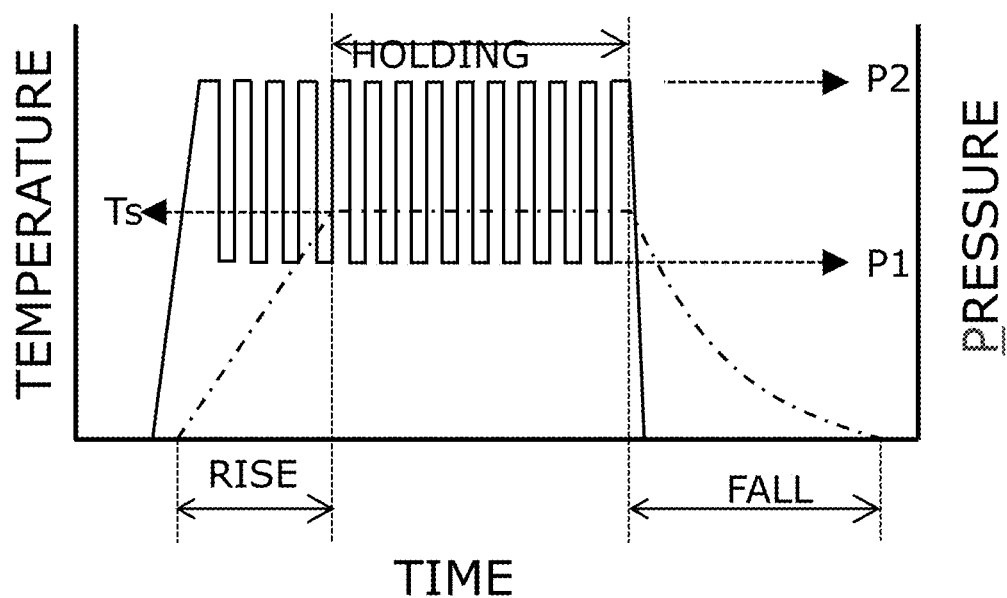
FIG. 7B is a diagram schematically showing another example of the relationship between a temperature and pressure of a mixed powder, and an elapsed time during a period of time from the start to end of a pulsed electric current sintering step.

FIG. 7A is a diagram showing an example of the "cyclic pressurization" during sintering. In this example, during the sintering time, a first pressure P1 and a second pressure P2 higher than the first pressure P1 are repeatedly applied to the mixed powder. In one example, in the case in which the first pressure P1 is 10 MPa and the second pressure P2 is 40 MPa, for example, 10-50 cycles of pressure application are performed in the sintering step, where in each cycle, the first pressure P1 is applied for 10 seconds, and thereafter, the second pressure P2 is applied for 20 seconds. As described below, by varying the pressure during the sintering time, a denser composite material is obtained, i.e., the relative density thereof is increased. This contributes to an increase in the thermal conductivity of the composite material. FIG. 7B is a diagram showing another example of the "cyclic pressurization" during sintering. As shown in FIG. 7B, the first pressure and the second pressure higher than the first pressure may be repeatedly applied to the mixed powder during temperature rise period, and then during maintaining the sintering peak temperature Ts.

Figure 8:
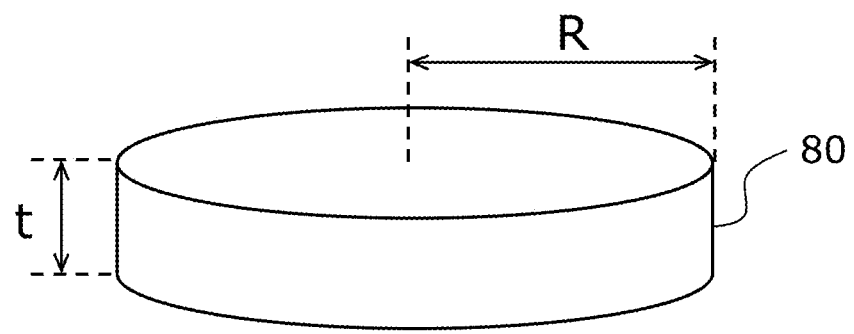
FIG. 8 is a perspective view schematically showing an outer shape of a composite material produced according to an embodiment of the present disclosure.

FIG. 8 is a perspective view schematically showing an example outer shape of a composite material 80 produced according to the present embodiment. In this example, the composite material 80 is in a disc-like shape having a thickness of T [mm] and a radius of R [mm]. The thickness T is, for example, 0.2 mm or greater and 20.0 mm or less. The radius R is, for example, 3 mm or greater and 200 mm or less. The composite material 80 immediately after sintering may not have a disc-like shape, and may be in a cuboid shape or other polyhydric shape, and may have stripe grooves or a regular protrusion-and-recess pattern at a surface thereof. A shape of the composite material 80 immediately after sintering as viewed from above is defined by the shape of a cross-section thereof taken in an axial direction perpendicular to the cavity 20 of FIG. 5. For example, in the case in which the die 30 of FIG. 5 has a prism-shaped through hole, and the lower end surface of the upper punch 40 and the upper end surface of the lower punch 50 are a flat rectangular surface, the composite material 80 taken out from the sintering device 100 may be in a rectangular thin plate shape in a top view. After being taken out from the sintering device 100, the composite material 80 is subjected to a treatment to reduce a thickness of the composite material 80 to an appropriate thickness. Examples of the treatment to reduce a thickness of the composite material 80 include polishing such as cutting and polishing, and laser processing. A single composite material 80 may be separated into a plurality of individual heat dissipation members.

Figure 9:
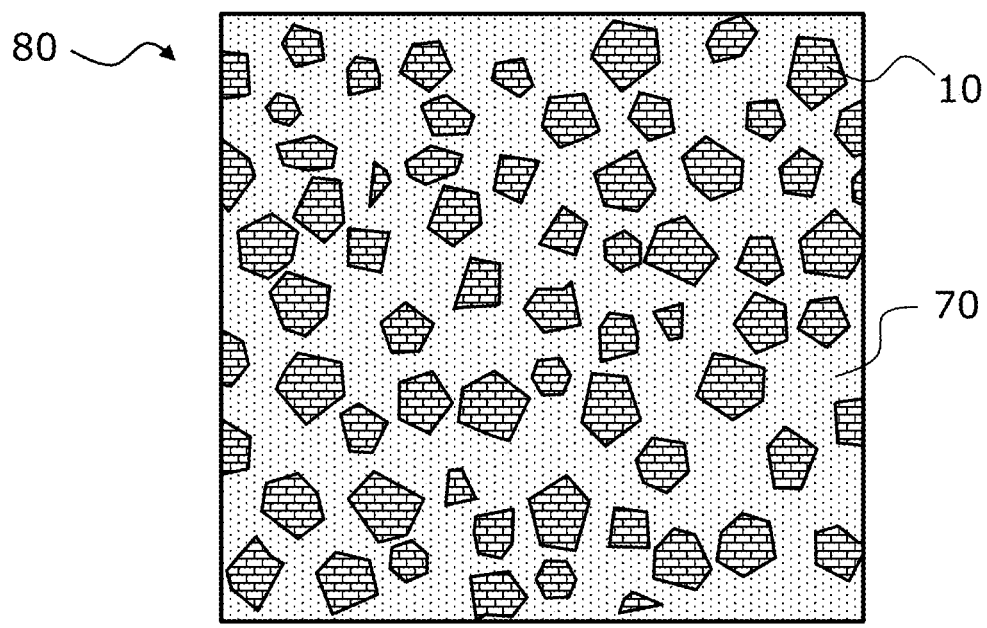
FIG. 9 is an enlarged cross-sectional view schematically showing a portion of a composite material produced according to an embodiment of the present disclosure.

FIG. 9 is a schematic enlarged view showing a portion of a cross-section of the composite material 80 thus produced. FIG. 9 is based on cross-sectional observation using an optical microscope. The composite material 80 shown in FIG. 9 contains Cu 70 as a metal matrix, and a large number of diamond particles 10 dispersed in the Cu 70. The Cu 70 is a metal body in which the Cu powder particles included in the mixed powder are sintered to be integrated together by the passage of a pulsed electric current. The individual diamond particles 10 contained in the composite material 80 are those originally included in the mixed powder. While the diamond particle 10 may be partially chipped in the pulsed electric current sintering step, a plurality of diamond particles are not joined together to grow into a new single particle.

Through the method of producing a composite material described above, a Cu-diamond composite material can be produced at a low temperature and under a low pressure compared to the techniques described in Japanese Patent Publication No. 2019-502251 and Japanese Patent Publication No. 2008-248324, which allows for obtaining a Cu-diamond composite material having a thermal conductivity of, for example, 460 [W/mK] or more. Furthermore, a composite material having a thermal conductivity of 500 [W/mK] or more can be obtained. Furthermore, a composite material having a thermal conductivity of 600 [W/mK], preferably 690-710 [W/mK] or more, can be obtained. This is thought to be attributed to that setting the sintering temperature and pressure to be lower than those that are conventionally considered to be necessary allows for reducing or avoiding a degradation in thermal conductivity of diamond particles or a Cu-diamond interface that may occur during high-temperature and high-pressure sintering.

In the method of producing a composite material described above, a difference in temperature by which the Cu-diamond MMC is cooled to room temperature after pulsed electric current sintering is small compared to the techniques described in Japanese Patent Publication No. 2019-502251 and Japanese Patent Publication No. 2008-248324. The amount of expansion and contraction of each of copper and diamond depending on a difference in coefficient of linear expansion therebetween in the embodiment described above is small compared to the techniques described in Japanese Patent Publication No. 2019-502251 and Japanese Patent Publication No. 2008-248324. Thus, copper and diamond are less likely to be separated from each other due to the difference in coefficient of linear expansion, which allows decrease in thermal conductivity.

Referring again to FIG. 3A, step S200 will be described. In step S200, the Cu-diamond composite material is subjected to a treatment to reduce a thickness thereof. The treatment to reduce a thickness the Cu-diamond composite material includes polishing and laser processing. Polishing can be performed using various polishing techniques, such as rough polishing, fine polishing, fixed abrasive grain processing (grinding), and free abrasive grain processing (polishing).

As used herein, the expression "polishing" encompasses "grinding," which refers to scraping of a surface of the composite material 80 using abrasive grains having high hardness, such as diamond. In general, "grinding" refers to scraping of a surface portion of an article to be processed, using abrasive grains, and a surface appearing due to grinding, i.e., a processed surface, is not necessarily a smooth surface. Meanwhile, "polishing" generally refers to cutting a surface of an article to be processed, using abrasive grains, to form a smooth surface. The Cu-diamond composite material contains diamond, and therefore, an ideally smooth surface may not be formed by polishing. Collision or friction with abrasive grains may cause diamond particles to come off from a surface of the composite material, and therefore, even after polishing, recesses and protrusions similar to the size of diamond particles may remain at the processed surface of the composite material. Therefore, in the present disclosure, polishing and grinding are not distinguished from each other, the "polishing step" encompasses a step of performing polishing and/or grinding.

Figure 10:
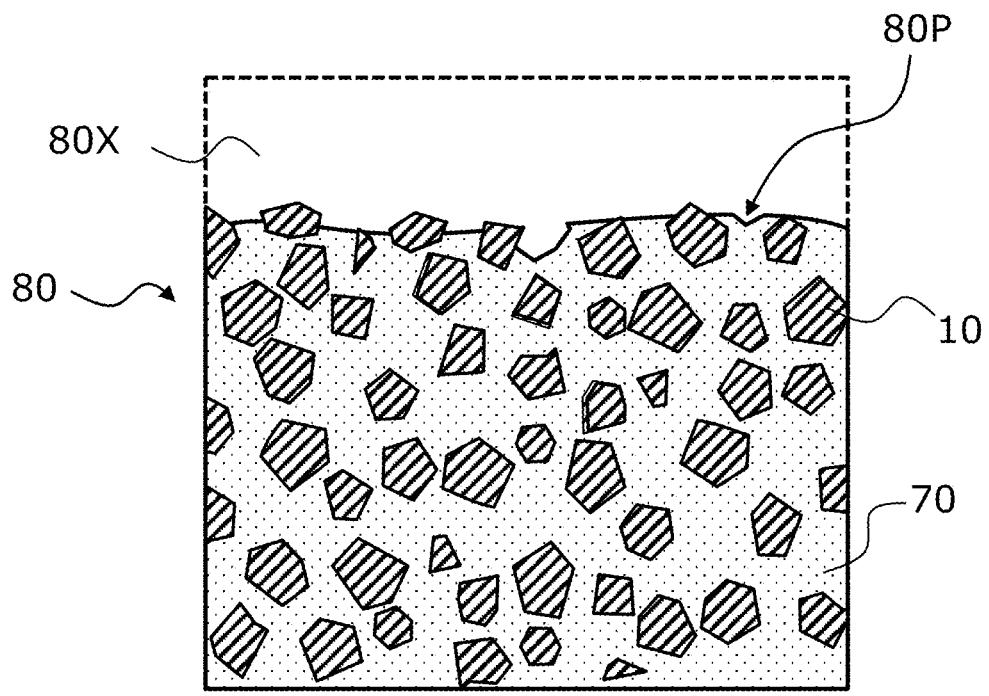
FIG. 10 is an enlarged cross-sectional view schematically showing a portion of a composite material subjected to a treatment to reduce thickness in an embodiment of the present disclosure.

FIG. 10 is a cross-sectional view schematically showing a processed surface 80P and neighboring portions of the composite material 80. A portion cut away by the treatment to reduce thickness is indicated by reference character "80X." In the example of FIG. 10, the processed surface 80P has recesses and protrusions similar to the size of the diamond particles 10. The thickness of the composite material 80 depends on the size of a package in which the composite material is mounted. Therefore, the treatment to reducing a thickness of the composite material is continued until the composite material has a desired thickness. For example, in the case in which the composite material 80 has a thickness of 1 mm before the treatment to reduce thickness, the thickness of the composite material 80 after the treatment to reduce thickness may be 100 μm or greater and 800 μm or less. Such a polishing step allows the thickness of the composite material 80 immediately after pulsed electric current sintering to be sufficiently greater than a required thickness of a heat dissipation member to be obtained. The present inventors' experiments demonstrated that if the composite material 80 to be produced is excessively thin, for example, heat generated by pulsed electric current sintering during the sintering step may be unevenly distributed, resulting in an increase in variations in characteristics of the composite material 80. Therefore, if the composite material 80 having a thickness greater than a target value based on the premise that the thickness of the prepared composite material 80 will be adjusted to a target value by the treatment to reduce thickness, variations in characteristics thereof can be reduced.

However, the present inventors' further study demonstrated that the thermal conductivity of the composite material 80 after the thickness reduction treatment may be, for example, about 80% of the thermal conductivity before the polishing step. This is attributed to a reduction in relative density and thermal diffusivity of the composite material 80. For example, in the polishing, a stress is generated when a portion of the composite material 80 is scraped, which increases thermal resistance at an interface between the diamond particle 10 and the Cu 70, resulting in reduction in relative density and thermal diffusivity of the composite material 80. The reduction in relative density and thermal diffusivity of the composite material 80 is also partially attributed to a reduction in adhesion between diamond and Cu in the composite material due to vibration during polishing. The reduction in relative density indicates the occurrence of a plurality of empty cavities in the composite material 80. In the case in which laser processing is performed, the composite material is locally heated, so that the temperature of the composite material increases. Accordingly, the difference in coefficient of linear expansion between the diamond particle 10 and the Cu 70 may cause a reduction in adhesion between diamond and Cu in the composite material. Such a factor in reduction of the thermal conductivity caused by treatment to reduce thickness will be hereinafter referred to as a "defect" or "damage" to the composite material. Note that the reduction of the thermal conductivity described above caused by treatment to reduce may also occur in the case in which the matrix of the composite material contains a metal other than Cu.

In this embodiment, as shown in FIG. 3A, after step S200 in which the treatment to reduce thickness is performed, the step S300 of repairing defects is executed by the second pulsed electric current sintering. In step S300, the degree of defects or damage caused by the treatment to reduce thickness can be reduced, or the composite material can be recovered to a state before the treatment to reduce thickness. As a result, the thermal conductivity lowered due to the treatment to reduce thickness can be increased. In other words, by the second pulsed electric current sintering, the thermal diffusivity of the composite material 80 can be increased to be higher than that before the second pulsed electric current sintering. The second pulsed electric current sintering can be performed with a pressure of less than 50 MPa applied to the composite material. By performing the second pulsed electric current sintering under a pressure of less than 50 MPa, the composite material is sintered again, so that the composite material becomes denser. Therefore, the thermal conductivity lowered due to the treatment to reduce thickness can be effectively increased.

In one embodiment, the second pulsed electric current sintering is performed under conditions of a low temperature and a low pressure. More specifically, for example, in the sintering device 100 shown in FIG. 5, the composite material 80 after the treatment to reduce thickness is placed in the cavity 20 formed between the upper punch 40 and the lower punch 50. As the sintering device 100, a sintering device configured to perform pulsed electric current sintering is used. When the composite material 80 is prepared by subjecting a mixed powder of Cu and diamond to pulsed electric current sintering, it is preferable to use a sintering device that is the same as or the same type as that is used in preparing of the composite material 80. By the second pulsed electric current sintering, the composite material 80 is maintained at a temperature that is, for example, higher than or equal to 500° C. and lower than 800° C. with a pressure of, for example, 5 MPa or greater and 50 MPa or less applied thereto. The applied pressure is preferably 5 MPa or greater and 40 MPa or less. The maintenance time, which depends on the maintenance temperature, is, for example, 60 seconds or more and 1800 seconds or less. The pressure may be applied as the "cyclic pressurization" described above. The pulsed electric current sintering technique for increasing the thermal conductivity lowered due to the treatment to reduce thickness can, for example, include the continuous pressurization and cyclic pressurization described above with reference to FIG. 6 and FIG. 7A and FIG. 7B, under the conditions described above.

Figure 11:
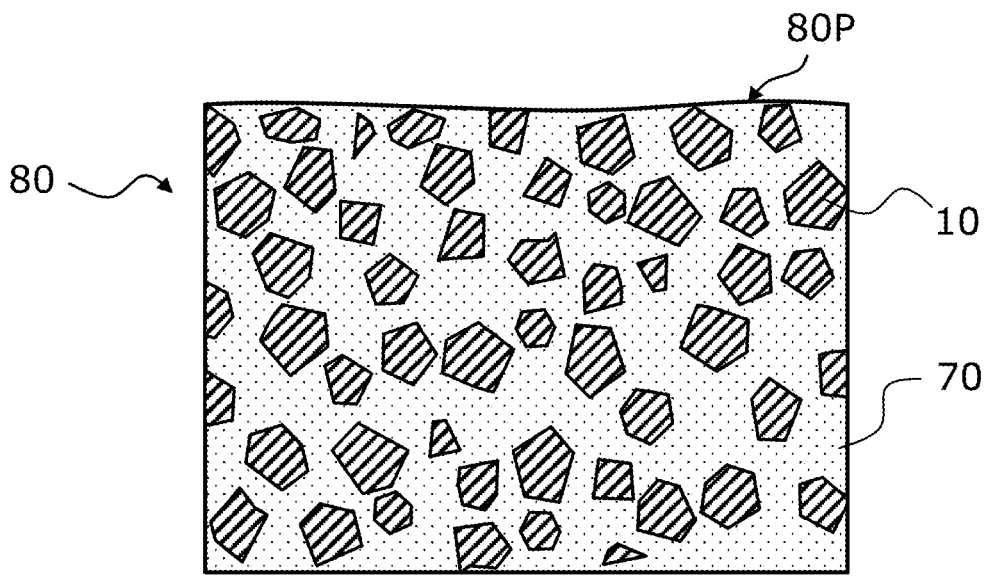
FIG. 11 is an enlarged cross-sectional view schematically showing a portion of a composite material serially subjected to a treatment to reduce thickness and then to pulsed electric current sintering in an embodiment of the present disclosure.

FIG. 11 is a cross-sectional view schematically showing a state of the composite material 80 that has been subjected to the treatment to reduce thickness and then to the second pulsed electric current sintering. The second pulsed electric current sintering causes reduction of the degree of defects or damage that has been caused by the treatment to reduce thickness, so that the composite material 80 can be recovered to the state before the treatment to reduce thickness. The relative density of the composite material 80 is increased due to the temperature and pressure in the second pulsed electric current sintering step, which causes reduction in the thermal resistance at an interface between diamond particles and Cu decreases or shortening of the heat dissipation path to increase the thermal diffusivity, which is thought to cause the recovery of the composite material 80.

In addition, it was demonstrated that by the second pulsed electric current sintering, the thermal diffusivity of the composite material is increased compared to that before the second pulsed electric current sintering. The thermal conductivity and the thermal diffusivity have the relationship described below.

Thermal conductivity [W/m·K]=thermal diffusivity [m$^2$/sec]×specific heat [J/K·kg]×density [kg/m$^3$]

According to the result of experiments described below, the relative density and thermal conductivity that are lowered due to the treatment to reduce thickness are both increased by the second pulsed electric current sintering. In addition, according to, for example, Example 1 described below, the ratio by which the thermal conductivity is increased through the second pulsed electric current sintering is greater than the ratio by which the relative density is increased through the second pulsed electric current sintering. This indicates that the second pulsed electric current sintering increases the thermal diffusivity itself of the composite material 80 lowered due to the treatment to reduce thickness. In other words, it is thought that the second pulsed electric current sintering not only increases the relative density of the composite material subjected to the treatment to reduce thickness, but also contributes to repair defects and damage caused by the treatment to reduce thickness.

The second pulsed electric current sintering may be performed with a metal powder or metal plate placed in contact with the processed surface 80P of the composite material 80. Examples of such a metal include Cu, Al, CuW, and CuMo. Cu is preferably used in view of thermal conductivity and easiness of handling. CuW is preferably used in view of reducing a difference in thermal expansion between the metal and the composite material 80. The Cu powder or Cu plate is likely to be bonded to and integrated with Cu in the composite material 80. Through the second pulsed electric current sintering, the metal powder can form a metal layer bonded to the processed surface 80P of the composite material 80. Also, when the metal plate is placed in contact with the processed surface 80P of the composite material 80, the second pulsed electric current sintering causes the metal plate to be formed into a metal layer bonded to the processed surface 80P of the composite material 80. When the metal plate has a sufficiently small thickness, the metal plate does not need to have self-stiffness. Such a thin metal plate may also be referred to as a metal thin film or foil.

Figure 12:
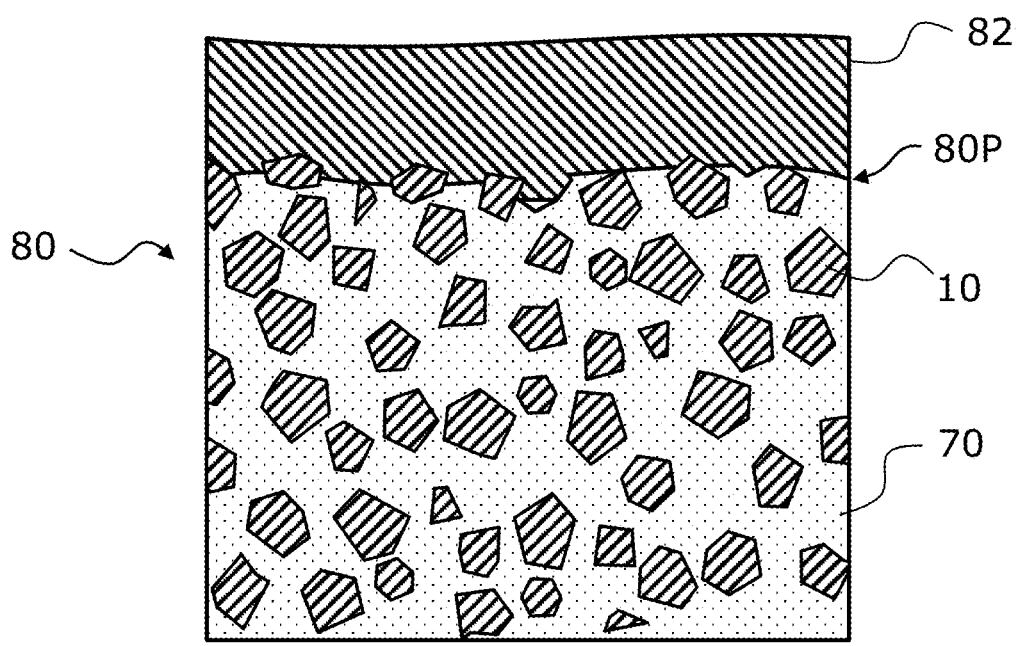
FIG. 12 is an enlarged cross-sectional view schematically showing a portion of a composite material having a metal layer formed thereon in an embodiment of the present disclosure.

FIG. 12 is a cross-sectional view schematically showing a portion of the composite material 80 having a metal layer 82 thus formed. Integral sintering is achieved between the metal layer 82 formed by the second pulsed electric current sintering and the underlying composite material 80. In particular, when the metal layer 82 is formed of Cu, the metal layer 82 is continuous to Cu contained in the composite material 80. By such integral sintering, the composite material 80 and the metal layer 82 can be more firmly bonded together than in the case in which the metal is bonded to the processed surface 80P of the composite material 80 in a physical or chemical manner, or the case in which the metal layer is bonded to the composite material 80 with an adhesive material interposed therebetween.

The surface of the metal layer 82 is pressed against the lower end surface of the upper punch 40, for example, in the sintering device 100 shown in FIG. 5 in the second pulsed electric current sintering step. At this time, the pressure is, for example, 5 MPa or greater and 50 MPa or less, and the temperature is, for example, higher than or equal to 500° C. and lower than 800° C. This allows the softened metal to be firmly bonded to the processed surface 80P. The pressure at this time is preferably 5 MPa or greater and 40 MPa or less.

The thermal conductivity of the metal layer 82 is no more than about 400 [W/mK], and accordingly, an excessively thick metal layer 82 would result in reduction in the thermal conductivity of a heat dissipation substrate in which the composite material 80 and the metal layer 82 are integrally sintered. Therefore, the thickness of the metal layer 82 is preferably, for example, 50 μm or greater and 500 μm or less.

Performing pulsed electric current sintering with a metal powder placed in contact with the processed surface of the composite material 80 to form the metal layer 82 allows for facilitating increasing adhesion of the metal layer 82 to the composite material 80.

In the case in which the metal layer 82 is formed by the second pulsed electric current sintering with a metal plate placed in contact with the processed surface of the composite material 80, a metal plate having a predetermined thickness can be used, which allows for facilitating adjustment of the thickness of the metal layer 82 to a target value. In addition, in the case of using a metal plate, the thermal conductivity of the metal plate can be maintained similar to the thermal conductivity of a metal that is used for a material of the metal plate. Therefore, with the composite material 80 having a thickness of equal to or greater than a predetermined thickness, the thermal conductivity of a heat dissipation substrate obtained by integral sintering of the composite material 80 and the metal layer 82 can be easily improved.

The metal layer 82 thus formed contains substantially no diamond particles 10, and accordingly can have a surface smoother than the processed surface 80P of the composite material 80. When a heat generation source such as a semiconductor light emitting device is in thermal contact with a heat dissipation member, the smooth surface allows for providing a larger effective contact area, which contributes to a reduction in thermal resistance. In addition, with the metal layer 82 located on the surface of the composite material 80, the effect of facilitating plating, etc., can be obtained.

By separating the composite material 80 having the metal layer 82 thus obtained into individual pieces, a plurality of heat dissipation substrates can be obtained from the composite material 80. Alternatively, the composite material 80 may be used as a single heat dissipation substrate without being separating into individual pieces.

The second pulsed electric current sintering can be performed without placing a metal powder or metal plate in contact with the processed surface 80P of the composite material 80. In that case, a material having a thermal conductivity lower than that of diamond is not added to the composite material. This allows for increasing the thermal conductivity of the heat dissipation substrate after the second pulsed electric current sintering to be close to the thermal conductivity of the original composite material.

Example 1

A Cu-diamond MMC composite material was prepared. The composite material was obtained as described below. Cu powder particles having an average particle size of 5 μm and diamond particles having an average particle size of 250 μm were mixed together to obtain a mixed powder. The total weight of the mixed powder was 6.24 grams. The entire mixed powder contained 60 percent by mass of the Cu powder particles, 20 percent by mass of the diamond particles having an average particle size of 250 μm, and 20 percent by mass of diamond particles having an average particle size of 60 μm. Next, a Cu-diamond MMC having a thickness of 3 mm was prepared using a sintering device (model: SPS-515S) manufactured by SPS Syntex, Inc. The sintering peak temperature Ts was 670° C., and the applied pressure was 36 MPa. The sintering peak temperature Ts was maintained for 10 minutes. The degree of vacuum at the start of sintering was 10 Pa. The size of the composite material was 20 mm (diameter)×2.731 mm (thickness). After the composite material was obtained, the density and thermal diffusivity thereof were measured. Conditions under which the composite material was prepared are shown in Table 1.

Next, the composite material thus prepared was subjected to polishing to form a processed surface of the composite material. By the polishing, the thickness was reduced by 0.184 mm. After the processed surface was formed, the density and thermal diffusivity of the composite material were measured.

Next, the composite material having the processed surface thus formed was subjected to pulsed electric current sintering using the above sintering device to obtain a heat dissipation substrate. In this pulsed electric current sintering, the composite material was processed singly without bringing a Cu powder or Cu plate into contact with the processed surface of the composite material. The sintering peak temperature Ts was 660° C., and the applied pressure was 36 MPa. The sintering peak temperature Ts was maintained for 10 minutes. The degree of vacuum at the start of sintering was 10 Pa. This pulsed electric current sintering caused reduction in the thickness of the composite material by 0.122 mm. After the heat dissipation substrate was obtained, the density and thermal diffusivity thereof were measured.

In Example 1 and each example described below, while the sintering peak temperature Ts is maintained, the value of a current was 350 A or greater and 700 A or less. The applied voltage had a pulse width of 3.3 milliseconds.

Example 2

A heat dissipation substrate was obtained in a manner as in Example 1, except for the differences described below.

A composite material was prepared using Cu powder particles and diamond particles at a different mixing ratio. The mixed powder contained 65 percent by mass of the Cu powder particles, 20 percent by mass of diamond particles having an average particle size of 250 µm, and 15 percent by mass of diamond particles having an average particle size of 60 µm, with respect to the entire mixed powder. Pulsed electric current sintering was performed, where the sintering peak temperature Ts was 660° C. Conditions for the production of the composite material described above are shown in Table 1.

The composite material was subjected to polishing to form a processed surface, and thereafter, the second pulsed electric current sintering was performed with a Cu plate placed in contact with the processed surface, to obtain a heat dissipation substrate. Conditions for the second pulsed electric current sintering were similar to those for the preparation of the composite material.

Example 3

A heat dissipation substrate was obtained using a method that was the same as that in Example 2, except for the following points.

In preparation of a composite material, a first and a second pressure were repeatedly applied, where the first pressure was 10 MPa and the second pressure was 36 MPa. The application of the first pressure was maintained for 15 seconds, the application of the second pressure was maintained for 20 seconds, and the sum of times it took to change the pressures was 50 seconds. The total time of a single cycle was 85 seconds. The number of cycles performed was 25. The sintering peak temperature Ts was maintained for 20 minutes. Conditions for the production of the above composite material are shown in Table 1.

The composite material was subjected to polishing to form a processed surface, and thereafter, pulsed electric current sintering was performed with Cu powder particles placed in contact with the processed surface, to obtain a heat dissipation substrate. Conditions for the pulsed electric current sintering were similar to those for the preparation of the composite material.

Thermal Conductivity

The thermal conductivity was determined for each of Examples 1 to 3. The thermal conductivity can be calculated by the product of the specific heat, density, and thermal diffusivity. The specific heat was calculated by weighting the literature values of the specific heats of diamond and Cu by the respective mass fractions in the mixture. The density was measured by Archimedes' technique. The thermal diffusivity was determined by a flash technique with a xenon lamp using a measurement device (model: LFA-447) manufactured by Netzsch Japan K. K. The measurement temperature was 25° C. In Example 1, the composite material had a thickness of 2.731 mm, a thickness of 2.547 mm after polishing, and a thickness of 2.425 mm after pulsed electric current sintering. In Example 2, the composite material had a thickness of 2.636 mm, and a thickness of 2.492 mm after polishing. The heat dissipation substrate had a thickness of 2.560 mm after pulsed electric current sintering. In Example 3, the composite material had a thickness of 2.636 mm, and a thickness of 2.445 mm after polishing. The heat dissipation substrate had a thickness of 2.510 mm after pulsed electric current sintering. The "relative densities" before polishing, after polishing, and after the second pulsed electric current sintering are shown in Table 2, the "thermal diffusivity" is shown in Table 3, and the "thermal conductivity" is shown in Table 4. The "relative density" in Table 2 represents the relative ratio of the actual density to the absolute specific gravity of the composite material. In Examples 2 and 3, the true density after the second pulsed electric current sintering is the density of the heat dissipation substrate obtained by sintering the composite material and Cu powder particles or a Cu plate, and therefore, the influence of the second pulsed electric current sintering on the density is obscure. Therefore, the relative density was determined for "after the composite material preparation," "after the processed surface formation," and "after the second pulsed electric current sintering," i.e., changes in relative density were studied.

TABLE 1

Experimental conditions

| | Sintering (° C.) temperature | Pressures (MPa) | | Average particle sizes (µm) | | Mass fractions (mass %) | | | Pressurization technique |
|---|---|---|---|---|---|---|---|---|---|
| | | First pressure | Second pressure | Small diamond particles | Large diamond particles | Cu | Small diamond particles | Large diamond particles | |
| Example 1 | 670 | 36 | | 60 | 250 | 60 | 20 | 20 | Continuous pressurization |
| Example 2 | 660 | 36 | | 60 | 250 | 65 | 15 | 20 | Continuous pressurization |
| Example 3 | 660 | 10 | 36 | 60 | 250 | 65 | 15 | 20 | Cyclic pressurization |

TABLE 2

| | Relative densities (%) | | |
|---|---|---|---|
| | After composite material preparation | After processed surface formation | After second pulsed electric current sintering |
| Example 1 | 94.2 | 93.4 | 95.2 |
| Example 2 | 96.7 | 95.6 | 96.3 |
| Example 3 | 97.2 | 96.3 | 97.0 |

TABLE 3

| | Thermal diffusivities (mm/s$^2$) | | |
|---|---|---|---|
| | After composite material preparation | After processed surface formation | After second pulsed electric current sintering |
| Example 1 | 298.5 | 234.5 | 282.7 |
| Example 2 | 296.3 | 239.1 | 232.3 |
| Example 3 | 306.4 | 241.7 | 240.3 |

TABLE 4

| | Thermal conductivities (W/mK) | | |
|---|---|---|---|
| | After composite material preparation | After processed surface formation | After second pulsed electric current sintering |
| Example 1 | 671.6 | 523.1 | 642.7 |
| Example 2 | 708.4 | 565.5 | 570.2 |
| Example 3 | 737.0 | 575.6 | 595.1 |

As can be seen from Tables 2 and 3, in all of the Examples 1 to 3, the relative density and thermal diffusivity decreased due to the polishing step. However, the relative densities of the heat dissipation substrates of Examples 1 to 3 that were subjected to the second pulsed electric current sintering after the formation of the processed surface all had a relative density higher than those after polishing. Likewise, the thermal conductivity after the second pulsed electric current sintering was higher than that after polishing.

Note that in Examples 2 and 3, a metal layer having a thickness of about 0.2 mm was present on the surface. This metal layer was formed by pulsed electric current sintering with Cu powder particles or a Cu plate placed in contact with the polish-processed surface of the composite material, i.e., the metal layer was a Cu layer that does not contain diamond particles. Meanwhile, in Example 1, diamond particles were also present in a surface region of the heat dissipation substrate. Therefore, in the heat dissipation substrates of Examples 2 and 3 in which the Cu layer was subjected to integral sintering, it seems that the thermal diffusivity after pulsed electric current sintering did not increase, as shown in Table 3. However, taking into consideration the great increase in thermal conductivity in Example 1, and the presence of the Cu layer having a thermal diffusivity lower than that of diamond in Examples 2 and 3, it can be concluded that the thermal diffusivity of the composite material 80 itself increased due to pulsed electric current sintering in all of Examples 1 to 3.

Next, an example of the step of providing a composite material comprising diamond and Cu will be described.

Experimental Example 1

Cu powder particles having an average particle size of 5 μm and diamond particles having an average particle size of 250 μm were mixed together to obtain a mixed powder. The total weight of the mixed powder was 6.24 grams. The entire mixed powder contained 80 percent by mass of the Cu powder particles and 20 percent by mass of the diamond particles. Next, a Cu-diamond MMC having a thickness of 3 mm was prepared using a sintering device (model: SPS-515S) manufactured by SPS Syntex, Inc. The sintering peak temperature Ts was 500° C., and the applied pressure was 36 MPa. The sintering peak temperature Ts was maintained for 10 minutes. The degree of vacuum at the start of sintering was 10 Pa. Conditions under which the composite material was produced and an estimated thermal conductivity are shown in Table 5.

Experimental Examples 2 to 6

In Experimental examples 2 to 6, Cu-diamond MMCs were obtained in a manner as in Experimental example 1, except that only the sintering temperature, or both of the sintering peak temperature Ts and the applied pressure, were changed as shown in Table 5 below. In Experimental example 5, diamond particles were a bimodal mixed powder. The Cu-diamond MMCs contained 10 percent by mass of diamond particles having an average particle size of 60 μm, and 20 percent by mass of diamond particles having an average particle size of 250 μm, with respect to the entire Cu-diamond MMCs.

Experimental Example 7

A composite material was obtained in a manner as in Example 1, except for the differences described below. The first and second pressures were repeatedly applied, where the sintering temperature was 640° C. the first pressure was 10 MPa, and the second pressure was 36 MPa. The application of the first pressure was maintained for 15 seconds, the application of the second pressure was maintained for 20 seconds, and the sum of times it took to change the pressures was 50 seconds. The total time of a single cycle was 85 seconds. The number of cycles performed was 25. The sintering peak temperature Ts was maintained for 20 minutes.

Experimental Examples 8 and 9

Cu-diamond MMCs were obtained under different conditions as shown in Table 5.

In Experimental examples 1 to 9, in the step of providing a composite material, a mixed powder of diamond particles and copper powder particles was prepared, and pulsed electric current sintering was performed on the mixed powder with a pressure of 5 MPa or greater and 100 MPa or less applied thereto and the temperature maintained higher than or equal to 500° C. and lower than 800° C., to obtain a composite material from the mixed powder. The composite materials of Experimental examples 1 to 9 had a thermal conductivity higher than that of Cu alone. The composite materials of Experimental examples 1 to 9 can be used as those of Examples 1 to 3.

TABLE 5

Conditions for production of composite material

| | Sintering temperature (° C.) | Pressures (MPa) First pressure | Pressures (MPa) Second pressure | Average particle sizes (μm) Small diamond particles | Average particle sizes (μm) Large diamond particles | Cu | Mass fractions (mass %) Small diamond particles | Mass fractions (mass %) Large diamond particles | Pressurization technique | Result Thermal conductivity (W/m · K) |
|---|---|---|---|---|---|---|---|---|---|---|
| Ex. ex. 1 | 500 | 36 | | | 250 | 80 | | 20 | Continuous pressurization | 586.3 |
| Ex. ex. 2 | 600 | 10 | | | 250 | 80 | | 20 | | 496.8 |
| Ex. ex. 3 | 600 | 36 | | | 250 | 80 | | 20 | | 625.7 |
| Ex. ex. 4 | 600 | 90 | | | 250 | 80 | | 20 | | 532.2 |
| Ex. ex. 5 | 640 | 36 | | 60 | 250 | 70 | 10 | 20 | | 672.1 |
| EX. ex. 6 | 750 | 36 | | | 250 | 80 | | 20 | | 486.2 |
| Ex. ex. 7 | 640 | 10 | 36 | 60 | 250 | 70 | 10 | 20 | Cyclic pressurization | 702.7 |
| EX. ex. 8 | 660 | 10 | 36 | 60 | 250 | 65 | 15 | 20 | | 673.2 |
| Ex. ex. 9 | 640 | 50 | 90 | 60 | 250 | 70 | 10 | 20 | | 606.4 |

Note)
Ex. ex. is the abbreviation of Experimental example.

Figure 13:
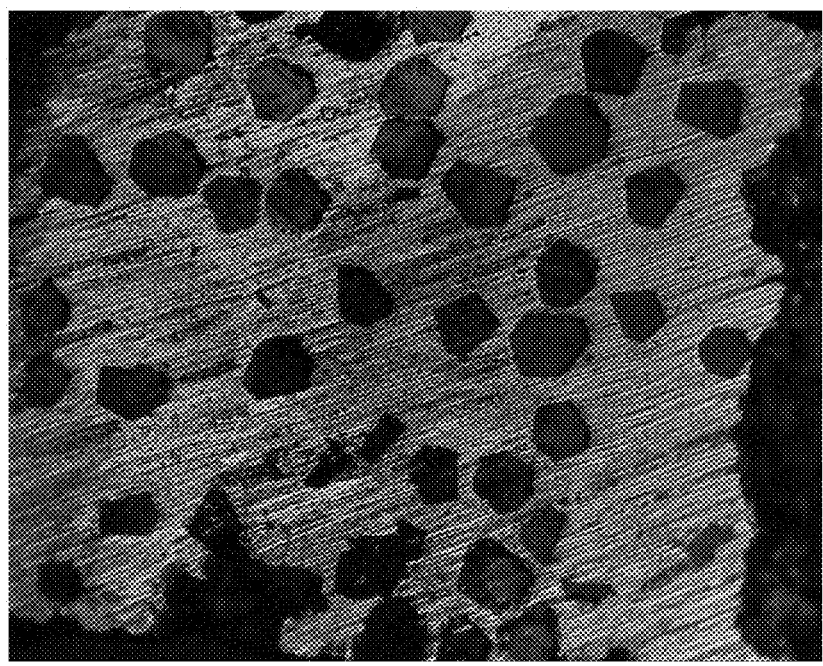
FIG. 13 is a microscopic photograph of a cross-section of a portion of a composite material in an experimental example.
Figure 14:
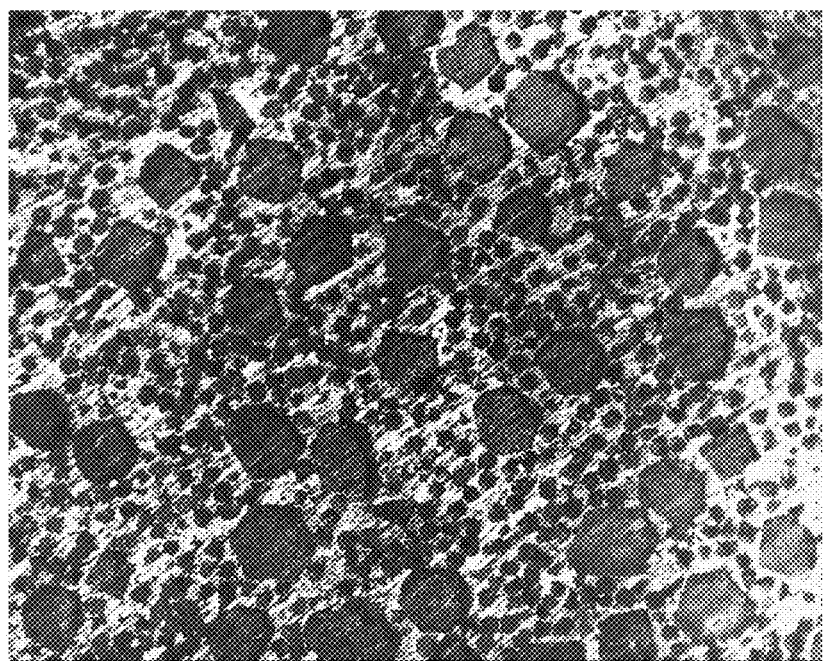
FIG. 14 is a microscopic photograph of a cross-section of a portion of a composite material in another experimental example.

FIG. 13 is an optical microscopic photograph of a cross-section of a portion of a composite material produced in a manner similar to that of Experimental example 3 of Table 5. FIG. 14 is an optical microscopic photograph of a cross-section of a portion of a composite material produced in a manner similar to that of Experimental example 7 of Table 5. In each photograph, a region having a relatively high lightness corresponds to a portion where Cu is present, and a region having a relatively low lightness corresponds to diamond particles. In the composite material of FIG. 14, relatively small diamond particles having an average particle size of 60 μm are located in spaces between relatively large diamond particles having an average particle size of 250 μm. Compared to the composite material of FIG. 13, the composite material of FIG. 14 contains an increased number of diamond particles and an increased total area of the surfaces thereof. This indicates an increase in interface area between Cu and diamond. The increase in interface area may cause an increase in thermal resistance due to poor adhesion between diamond and Cu, likely leading to a decrease in thermal conductivity. However, in this experimental example, such a phenomenon was not observed.

As can be seen from FIGS. 13 and 14, the composite materials of the above experimental examples are dense.

Application Examples

An example configuration of a light-emitting diode including a heat dissipation substrate produced in an embodiment of the present disclosure will be described.

Figure 15:
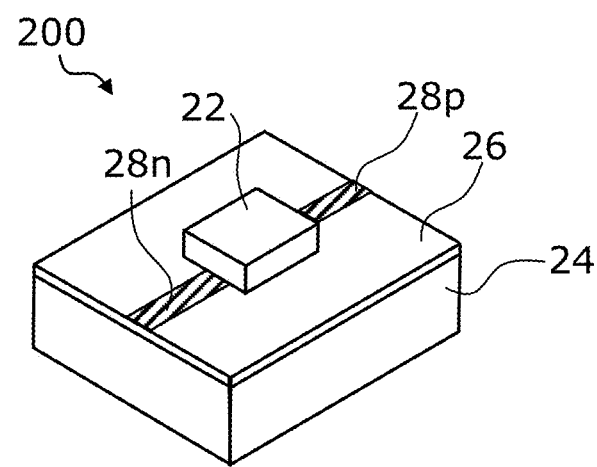
FIG. 15 is a perspective view schematically showing an example application of a composite material.

FIG. 15 is a perspective view schematically showing an example configuration of a light emitting device 200 including a light-emitting diode (LED) 22 and a heat dissipation substrate 24 supporting the LED 22. The heat dissipation substrate 24 was produced using the method of producing in the embodiments described above. An insulating layer 26 of, for example, AlN was disposed on an upper surface of the heat dissipation substrate 24. A positive interconnect 28p and a negative interconnect 28n were disposed on the insulating layer 26, and were electrically connected to a positive electrode and a negative electrode, respectively, of the LED 22. A lower surface of the heat dissipation substrate 24 was in thermal contact with a heat sink or cooling device (not shown). Heat generated in the LED 22 during operation spreads in in-plane directions due to the insulating layer 26, and thereafter, quickly dissipated out through the heat dissipation substrate 24.

The examples of configurations of the light emitting devices 200 and 300 described above are an example of the semiconductor device in which a composite material according to an embodiment of the present disclosure is used as a heat dissipation member. The composite material can be used in various applications.

The method of producing a heat dissipating substrate of the present disclosure provides a composite substrate that is applicable as various heat dissipation substrates. Examples of heat dissipation substrates include package bases, submounts, heat spreaders, packages, and heat sinks, which are brought into thermal contact with elements such as semiconductor light emitting devices, semiconductor integrated circuit devices, and monolithic microwave integrated circuit devices.

What is claimed is:

1. A method of producing a heat dissipation substrate, the method comprising:
    preparing a sintered composite material containing diamond and a metal, by performing steps comprising:
        preparing a mixed powder of diamond particles and metal powder particles, and
        producing the sintered composite material from the mixed powder by pulsed electric current sintering with a pressure of 5 MPa or greater and 100 MPa or less applied to the mixed powder, wherein the step of producing the composite material comprises repeatedly applying a first pressure and a second pressure higher than the first pressure with the mixed powder maintained at a temperature equal to or higher than 500° C. and lower than 800° C.;

performing a treatment on a surface of the sintered composite material to reduce a thickness of the sintered composite material, the treatment forming a processed surface of the sintered composite material; and subsequent to performing the treatment, performing pulsed electric current sintering with a pressure of less than 50 MPa applied to the sintered composite material, to heat the sintered composite material.

2. The method according to claim 1, wherein:
the step of performing pulsed electric current sintering subsequent to performing the treatment is performed with a metal powder or metal plate placed in contact with the processed surface of the sintered composite material, to form a metal layer bonded to the processed surface.

3. The method according to claim 2, wherein:
the metal layer has a thickness of 50 μm or greater and 500 μm or less.

4. The method according to claim 1, wherein:
the pulsed electric current sintering is performed without placing a metal powder or metal plate in contact with the processed surface of the sintered composite material.

5. The method according to claim 1, wherein:
the metal powder particles are copper powder particles.

6. The method according to claim 5, wherein:
an amount of metals other than copper in the mixed powder is 1% or less in mass fraction.

7. The method according to claim 5, wherein:
a mass fraction of the copper powder particles in the mixed powder is 60% or greater and 85% or less, and
a mass fraction of the diamond particles in the mixed powder is 15% or greater and 40% or less.

8. The method according to claim 1, wherein:
the diamond particles in the mixed powder have an average particle size of 200 μm or greater and 400 μm or less.

9. The method according to claim 1, wherein:
the diamond particles in the mixed powder include particles having an average particle size of 200 μm or greater and 400 μm or less, and particles having an average particle size of 40 μm or greater and 80 μm or less.

10. The method according to claim 1, wherein:
the metal powder particles have an average particle size of 3 μm or greater and 10 μm or less.

11. The method according to claim 1, wherein:
the treatment to reduce the thickness of the sintered composite material comprises at least one of cutting, polishing, or laser processing.

12. The method according to claim 1, wherein:
the step of performing the pulsed electric current sintering subsequent to performing the treatment comprises repeatedly applying a third pressure and a fourth pressure higher than the third pressure with the sintered composite material maintained at a temperature equal to or higher than 500° C. and lower than 800° C.

13. The method according to claim 12, wherein:
the third pressure is 5 MP or greater and less than 20 MP, and
the fourth pressure is 20 MP or greater and 40 MPa or less.

14. The method according to claim 1, wherein:
the first pressure is 5 MP or greater and less than 20 MP, and
the second pressure is 20 MP or greater and 40 MPa or less.

15. A method of producing a composite substrate, comprising:
providing a sintered composite material comprising diamond and a metal, the sintered composite material having been subjected to a treatment to reduce a thickness of the sintered composite material; and
subsequent to providing the sintered composite material that has been subjected to the treatment, performing pulsed electric current sintering with a pressure of less than 50 MPa applied to the sintered composite material, to heat the sintered composite material, wherein the step of performing pulsed electric current sintering comprises repeatedly applying a first pressure and a second pressure higher than the first pressure with the sintered composite material maintained at a temperature equal to or higher than 500° C. and lower than 800° C.

16. The method according to claim 15, wherein:
the treatment to reduce the thickness of the sintered composite material comprises at least one of cutting, polishing, or laser processing.

17. The method according to claim 15, wherein:
the step of providing the sintered composite material comprises:
preparing a mixed powder of diamond particles and metal powder particles, and
producing the sintered composite material from the mixed powder by pulsed electric current sintering with a pressure of 5 MPa or greater and 100 MPa or less applied to the mixed powder, wherein the step of producing the composite material comprises repeatedly applying a third pressure and a fourth pressure higher than the third pressure with the mixed powder maintained at a temperature equal to or higher than 500° C. and lower than 800° C.

18. The method according to claim 15, wherein:
the first pressure is 5 MP or greater and less than 20 MP, and
the second pressure is 20 MP or greater and 40 MPa or less.

19. A method of producing a heat dissipation substrate, the method comprising:
providing a composite material containing diamond and a metal, by performing steps comprising:
preparing a mixed powder of diamond particles and metal powder particles, and
producing the composite material from the mixed powder by pulsed electric current sintering with a pressure of 5 MPa or greater and 50 MPa or less applied to the mixed powder, and the mixed powder maintained at a temperature equal to or higher than 500° C. and lower than 800° C., wherein the step of producing the composite material comprises repeatedly applying a first pressure and a second pressure higher than the first pressure with the composite material maintained at the temperature;
performing a treatment on a surface of the composite material to reduce a thickness of the composite material, the treatment forming a processed surface of the composite material; and
subsequent to performing the treatment, performing pulsed electric current sintering with a pressure of less than 50 MPa applied to the composite material, to heat the composite material.

* * * * *